United States Patent
Schneider et al.

(10) Patent No.: US 6,535,454 B2
(45) Date of Patent: Mar. 18, 2003

(54) CIRCUIT CONFIGURATION FOR AN INTEGRATED SEMICONDUCTOR MEMORY WITH COLUMN ACCESS

(75) Inventors: Helmut Schneider, München (DE); Sabine Schöniger, Miesbach (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/750,399

(22) Filed: Dec. 28, 2000

(65) Prior Publication Data

US 2001/0019139 A1 Sep. 6, 2001

(30) Foreign Application Priority Data

Dec. 28, 1999 (DE) .......................... 199 63 502

(51) Int. Cl.⁷ ................................................ G11C 8/00
(52) U.S. Cl. ...................... 365/230.06; 365/230.08; 365/230.09; 365/193
(58) Field of Search ................... 365/230.06, 230.08, 365/193, 230.09

(56) References Cited

U.S. PATENT DOCUMENTS

| 3,962,686 A | 6/1976 | Matsue et al. ............... 340/173 |
| 3,969,706 A | 7/1976 | Proebsting et al. .......... 340/173 |
| 5,521,880 A | * 5/1996 | McClure .................... 365/233.5 |
| 5,625,595 A | 4/1997 | Ikeda ........................... 365/194 |
| 5,825,699 A | 10/1998 | Tanaka ........................ 365/200 |
| 5,940,329 A | * 8/1999 | Seitsigner et al. ....... 365/189.05 |

* cited by examiner

*Primary Examiner*—David Nelms
*Assistant Examiner*—Connie C. Yoha
(74) *Attorney, Agent, or Firm*—Laurence A. Greenberg; Werner H. Stemer; Gregory L. Mayback

(57) ABSTRACT

A circuit configuration for an integrated semiconductor memory has memory cells which are configured in a matrix-type memory cell array and which are combined to form addressable units of column lines and row lines. A decoder for selecting one of the column lines with a column select signal has a terminal for an input signal for activating the column select signal. A row activation signal serves for activating a row access signal sequence. The terminal for the input signal of the decoder is connected to a signal from the row access signal sequence which indicates that the row access is concluded. Successive signals in the memory access process prevent the column access from taking place before the end of the row access. The memory access is controlled in a self-adjusting manner.

4 Claims, 2 Drawing Sheets

CIRCUIT CONFIGURATION FOR AN INTEGRATED SEMICONDUCTOR MEMORY WITH COLUMN ACCESS

BACKGROUND OF THE INVENTION

Field of the Invention

The present invention relates to a circuit configuration for an integrated semiconductor memory having a memory cell array with memory cells which are combined to form units of column and row lines, in which one of the column lines is accessed.

Integrated semiconductor memories have memory cells which are often configured in a memory cell array, for example in a matrix-type memory cell array. In this case, the memory cells are usually combined to form addressable units of column lines and row lines. These may be, for example, bit lines and word lines, respectively, at the crossover points of which the memory cells are configured.

In the event of a read or write access to one of the memory cells, the relevant row line and column line are generally selected via a decoder. After the selection of the relevant row lines, data signals of the memory cells along the row line are present on the corresponding column lines. These signals are amplified in an adjacent so-called sense amplifier strip of the memory cell array. After selection of the relevant column line, the data signal of the addressed memory cell is released.

In order to achieve the best possible access times when writing to and reading from an integrated memory, it is necessary that the signal portions for selection of the row lines and of the column lines be dimensioned to be as short as possible in the interests of a short signal propagation time. The selection of a row line or a word line generally requires more time than the selection of a column line or a bit line. With regard to access control, however, the row line must have already been activated prior to the access of the column line in order, as much as possible, to avoid signal disturbances during the writing or reading operation. The resulting requirement is that the memory cell must not be accessed faster from the column side than from the row side.

If the memory cell is accessed at a point in time that is determined by external access commands, it has been customary hitherto for starting the column decoding at a point in time that is temporarily delayed relative to the point in time at which the row decoding is started in accordance with the above requirements. Adherence to this temporal delay is guaranteed externally by a memory controller in customary standard specifications. In fast semiconductor memories (RLDRAM, FCRAM, etc.), the specification is altered by external commands to the effect that the row and column addresses are transferred simultaneously by the controller. In this case, the temporal control of column and row access must be supervised internally, for example by means of a delay circuit which models the difference between the column access time and the row access time.

A delay circuit of this type has, for example, an inverter chain or generally delay stages constructed from logic gates. However, modeling propagation times in such a way generally reduces the robustness of the integrated circuit. Delay elements of this type are comparatively sensitive to process, temperature, and voltage fluctuations. This may result in the delay circuit having delay times that are variable and/or are not precisely adjustable. As a result, the functionality of the semiconductor memory may be impaired in the event of a memory access.

SUMMARY OF THE INVENTION

It is accordingly an object of the invention to provide a circuit configuration for a semiconductor memory which overcomes the above-mentioned disadvantageous of the prior art semiconductor memories of this general type, which can be applied to the above-described integrated semiconductor memory as well as to a number of types of semiconductor memories, and in which the functionality of the circuit is ensured, as far as possible, independently from external influences.

With the foregoing and other objects in view there is provided, in accordance with the invention, an integrated semiconductor memory circuit configuration that includes memory cells which are configured in a memory cell array and which are combined to form addressable units of column lines and row lines. The circuit configuration furthermore has a decoder for selecting one of the column lines, which is connected to a column select line for transmission of a column select signal. The decoder furthermore has a terminal for an input signal for activating the column select signal. The circuit configuration additionally has a terminal for a row activation signal which serves for activating a row access signal sequence, for example, with the aid of a corresponding word line decoder. The terminal for the input signal of the column decoder is connected to a terminal for at least one signal from the row access signal sequence which indicates by its state that the row access is concluded.

Therefore, the column select signal is not activated and hence the relevant column line is selected before the access to the associated row line is concluded. This means that, in the memory access process, the successive process steps of row decoding and column decoding are controlled by successive select signals. The memory access process thus acquires a self-adjusting method of operation.

In the case of a memory access of this type, the influence of the technology on the signal propagation time can thus be taken into account in a self-controlling manner. If the memory access control is clocked, for example, the successive memory access process steps described are independent of the clock frequency. The modeling of the signal propagation times by delay elements is obviated, thereby avoiding the susceptibility to process, temperature or voltage fluctuations.

In accordance with an added feature of the invention, the circuit configuration has a sense amplifier, which is assigned to one of the memory cells of a selected row line, with a terminal for an activation signal. The activation signal is part of the row access signal sequence. In the course of the row access, the relevant sense amplifier is activated and hence the row access is ended. Consequently, the activation signal of the sense amplifier is advantageously suited to activating the column select signal.

In accordance with an additional feature of the invention, it is possible for the terminal for the input signal of the decoder for activating the column select signal to be connected to a signal derived from the activation signal of the sense amplifier.

In accordance with another feature of the invention, the circuit configuration has a storage element with a set input, a reset input and an output. By way of example, a signal which releases the column access is present at the set input. Moreover, the circuit configuration has a logic gate which is connected to the output of the storage element and to the terminal for the signal from the row access signal sequence. The access signals for the column access and the row access are thus logically combined with one another. An output of the logic gate is connected to the terminal for the input signal of the decoder.

In accordance with a concomitant feature of the invention, the invention can advantageously be used in fast semiconductor memories such as, for example, RLDRAM or FCRAM, since the fastest possible propagation times in conjunction with high functional reliability are made possible by the self-adjustment.

Although the invention is illustrated and described herein as embodied in a circuit configuration for an integrated semiconductor memory with column access, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
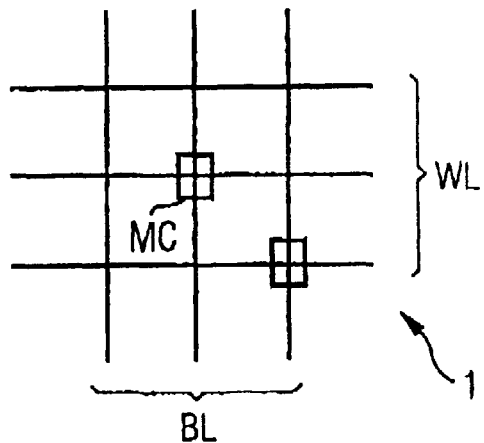
FIG. 1 shows a matrix-type memory cell array of an integrated semiconductor memory.

FIG. 1 shows a memory cell array 1 of a DRAM, for example, which is organized in the form of a matrix and has regular word lines WL and bit lines BL, at the crossover points of which, memory cells MC are configured. The memory cells MC of the shown memory each include a selection transistor and a storage capacitor. In this case, control inputs of the selection transistors are connected to one of the word lines WL, while a main current path of the selection transistors is configured between the storage capacitor of the respective memory cell MC and one of the bit lines BL.

Figure 2:
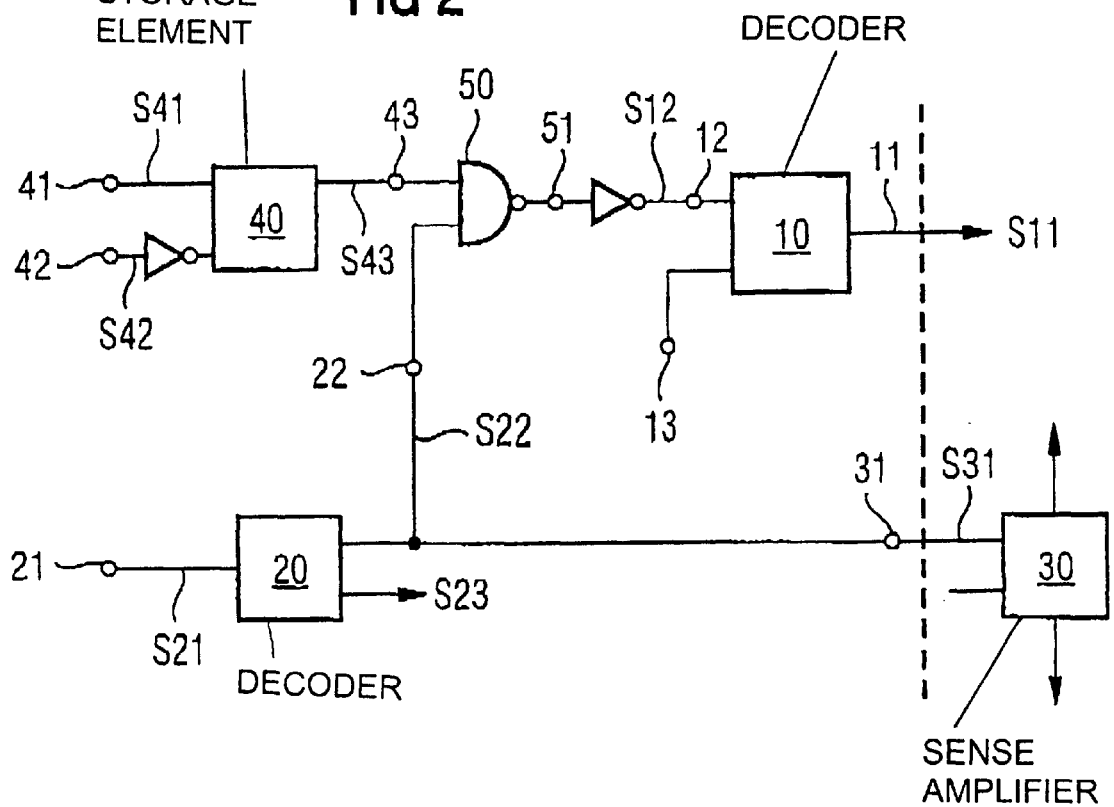
FIG. 2 shows an embodiment of a circuit configuration according to the invention for a semiconductor memory.

FIG. 2 shows an embodiment of a circuit configuration according to the invention for an integrated semiconductor memory. The circuit configuration has a decoder 10 for selecting one of the column lines BL, which is connected to a column select line 11 for transmission of a column select signal S11. The decoder 10 furthermore has a terminal 12 for an input signal S12 for activating the column select signal S11. A row activation signal S21, for activating a row access signal sequence, is present at a terminal 21. The sequence is generated with the aid of a word line decoder 20 and includes the signals S22 and S23. In this case, the signal S22 serves as an activation signal S31 for the sense amplifier 30 at the input 31 thereof. The signal S23 serves, for example, for activating a word line WL.

The circuit configuration furthermore includes a storage element 40 with a set input 41, a reset input 42, and an output 43. The output 43 of the storage element 40 is connected to the logic gate 50, just like the terminal 22 for the signal S22.

The output 51 of the logic gate 50 is connected via an inverter to the terminal 12 for the input signal S12 of the decoder 10. A further input 13 of the decoder 10 serves for inputting a pre-decoded column address. By way of example, the signal S41 is a column activation signal for enabling the column access. By way of example, the signal S42 is an activation signal which activates a memory bank in which the relevant column line is situated.

Figure 3:
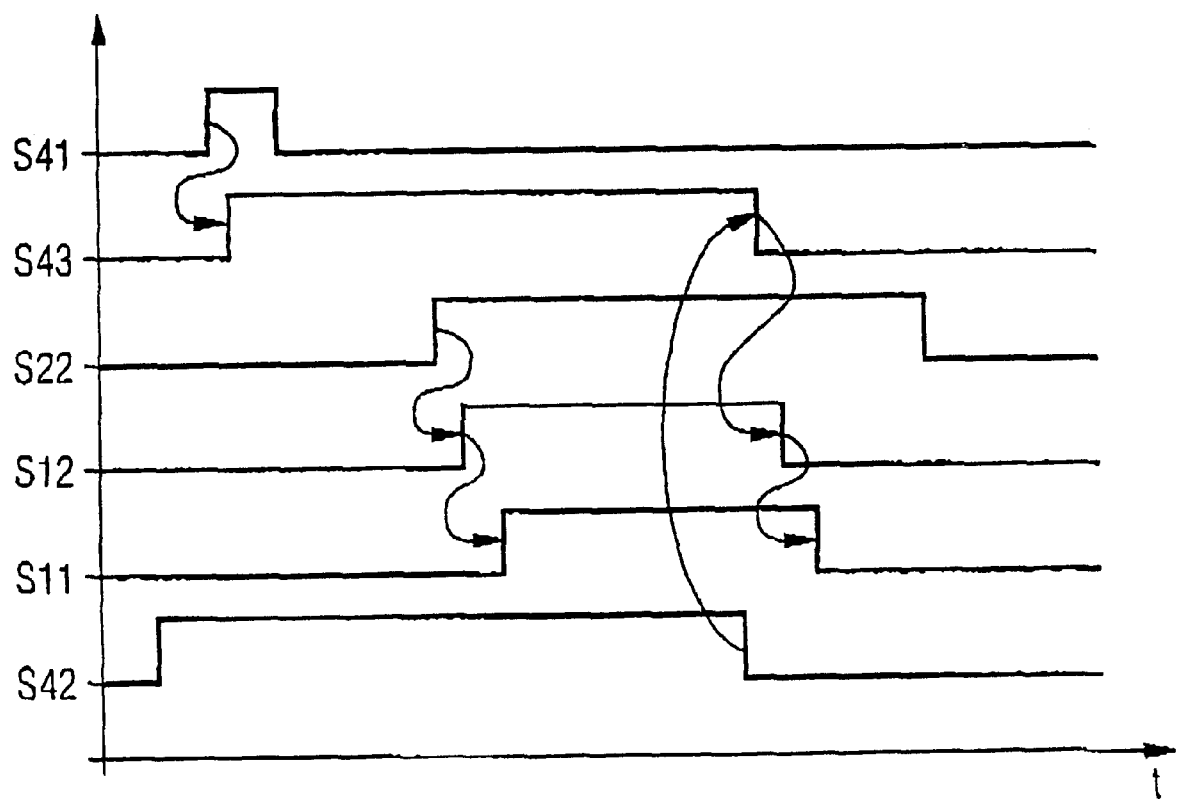
FIG. 3 shows a timing diagram in accordance with the circuit configuration according to FIG. 2.

FIG. 3 illustrates a timing diagram in accordance with the circuit configuration according to FIG. 2. The active column activation signal S41 sets the output 43 of the storage element 40 with the signal S43. The column select signal S11 of the addressed column line is set by the rising edge of the signal S22 via the decoder 10. Resetting is effected with the falling edge of the signal S42. In this case, the falling edge of the signal S42 is terminated in such a way that the column select signal S11 becomes inactive before the relevant word line is deactivated.

We claim:

1. An integrated semiconductor memory circuit configuration, comprising:

a memory cell array having column lines, row lines, and a plurality of memory cells addressable by said column lines and said row lines;

a decoder having a column select line connected to one of said column lines, said column select line for transmission of a column select signal to select said one of said column lines, said decoder having a terminal for receiving an input signal for activating the column select signal;

a terminal for receiving a row activation signal for activating a row access signal sequence; and a terminal for receiving at least one signal from the row access signal sequence which indicates by a state that a row access is concluded, said terminal for the at least one signal from the row access signal sequence connected to said terminal of said decoder.

2. The circuit configuration according to claim 1, comprising:

a sense amplifier assigned to one of said plurality of memory cells, said one of said plurality of memory cells associated with a selected row line;

said sense amplifier having a terminal for receiving an activation signal that is connected to said terminal for the at least one signal from the row access signal sequence.

3. The circuit configuration according to claim 2, comprising a terminal connected to said terminal of said decoder and providing a signal derived from the activation signal for the sense amplifier.

4. The circuit configuration according to claim 1, comprising:

a storage element having a set input, a reset input and an output;

a logic gate connected to said output of said storage element and to said terminal for the at least one signal from the row access signal sequence; and said logic gate having an output connected to said terminal of said decoder.

* * * * *